United States Patent [19]  [11]  4,177,072
Ono et al.  [45]  Dec. 4, 1979

[54] PROCESS FOR PREPARING A LITHOGRAPHIC PRINTING PLATE WITH A THIOUREA WETTING SOLUTION

[75] Inventors: Yoshihiro Ono; Shigeo Harada; Yuzo Mizobuchi; Tomoaki Ikeda, all of Asaka, Japan

[73] Assignee: Fuji Photo Film Co., Ltd., Minami-ashigara, Japan

[21] Appl. No.: 912,150

[22] Filed: Jun. 2, 1978

[30] Foreign Application Priority Data

Jun. 2, 1978 [JP] Japan .................................. 53/65151

[51] Int. Cl.² ........................... G03F 7/02; G03C 5/24
[52] U.S. Cl. .................................... 430/302; 101/455; 101/456; 101/458; 101/465; 430/309
[58] Field of Search ...................... 96/33, 27 R, 48 R; 101/455, 456, 458, 465

[56] References Cited

U.S. PATENT DOCUMENTS

| | | | |
|---|---|---|---|
| 3,637,383 | 1/1972 | Hallman et al. | 96/36 |
| 3,650,743 | 3/1972 | Hallman et al. | 96/33 |
| 3,678,852 | 7/1972 | Feinleib et al. | 101/465 |
| 3,707,372 | 12/1972 | Hallman et al. | 96/33 X |
| 3,762,325 | 10/1973 | Hallman et al. | 101/456 X |
| 4,000,334 | 12/1976 | Hallman et al. | 96/33 X |
| 4,082,861 | 4/1978 | Izu et al. | 96/33 X |
| 4,115,127 | 9/1978 | Ikeda et al. | 96/85 |

Primary Examiner—Edward C. Kimlin
Attorney, Agent, or Firm—Sughrue, Rothwell, Mion, Zinn and Macpeak

[57] ABSTRACT

A process for preparing a lithographic printing plate, which has excellent printability, durability and stability, which comprising imagewise irradiating a lithographic printing plate material comprising a support having thereon a light-sensitive layer comprising, as essential components, (a) an inorganic material and (b) at least one member selected from the group consisting of a metal and a metal compound, both of which are in contact with each other and which, upon irradiation with electromagnetic radiation, react with each other forming a mutually diffused state and as a result, a difference in the hydrophilic property or in the oleophilic property occurs between the areas irradiated with the electromagnetic radiation and the non-irradiated areas, with electromagnetic radiation, and then wetting the light-sensitive layer thereof with wetting solution containing (i) at least one compound selected from the group consisting of thiourea and a thiourea derivative and (ii) as an acid component, at least one compound selected from the group consisting of an inorganic acid, an acidic inorganic salt, and an organic acid.

7 Claims, No Drawings

PROCESS FOR PREPARING A LITHOGRAPHIC PRINTING PLATE WITH A THIOUREA WETTING SOLUTION

BACKGROUND OF THE INVENTION

1. Field of the Invention

The present invention relates to a process for preparing a lithographic printing plate, and more particularly, to an improvement in the characteristics of a lithographic printing plate comprising a support having thereon at least two kinds of materials which are mutually diffusible upon exposure to light.

2. Description of the Prior Art

As described in U.S. Pat. Nos. 3,637,377–81, 3,637,383, 3,663,224, 3,650,743 and 3,707,372 and Japanese Patent Application (OPI) No. 10018/74 (The term "OPI" as used herein refers to a "published unexamined Japanese patent application"), it is known that, when a light-sensitive element comprising a support having thereon a layer of a light-sensitive chalcogen or a certain kind of metal halide and a layer of a metal adjacent thereto is exposed to light, a mutual reaction occurs between both layers. If such a photoreaction occurs, the corresponding portions mutually diffuse into each other (form a mutually diffused state, the so-called photodoping phenomenon), and, as a result, various properties such as electric properties, e.g., electric resistivity, photoconductivity, photoelectromotive force, etc., light transmittance, light reflectance, solubility in an alkaline solution, hydrophilic or oleophilic properties and the like become different at the diffused portions from those of the original material. Property changes in this kind of a lightsensitive material due to light are extremely useful from a photographic technique standpoint, and are being utilized in a variety of fields where applicable. One of the major fields where such can be utilized is in producing lithographic printing plates.

For example, U.S. Pat. Nos. 3,650,743 and 3,707,372 disclose that if a radiation sensitive element comprising a support having thereon a first layer comprising a chalcogenide or a metal halide compound with a second layer comprising a metal laminated thereon is imagewise exposed to light, image areas with hydrophilic or oleophilic properties different from those at the non-exposed areas are formed, and, hence, a lithographic printing plate can be prepared merely by wetting the printing surface prior to inking, without any other processing being required. Therefore, the lithographic printing plate described in U.S. Pat. Nos. 3,650,743 and 3,707,372 does not require any processing following exposure, such as development, gum coating, lacquering, etc., which have been essential in the conventional production of lithographic printing plates using diazonium compounds, etc., so that it is very advantageous from the standpoints of time, cost and prevention of pollution. However, this lithographic printing plate has a disadvantage that the quality of the prints is far inferior to lithographic printing plates using diazonium compounds since the difference between the hydrophilic or oleophilic property exhibited by the mutual diffusion products described above and the oleophilic or hydrophilic property at the non-exposed areas is small in this lithographic printing plate.

Lithographic printing plates where this disadvantage has been minimized to some extent are described in Japanese Patent Applications (OPI) Nos. 125803/75 and 15703/77. However, the disadvantage described above has not been minimized sufficiently even in these lithographic printing plates.

SUMMARY OF THE INVENTION

An object of the present invention is to provide a process for preparing a lithographic printing plate, capable of being used to produce excellent prints, having a large difference either in the hydrophilic property or in the oleophilic property, between line image areas and non-line image areas, using a light-sensitive combination of materials which are mutually diffusible upon exposure to light.

A further object of the present invention is to provide a process for preparing a lithographic printing plate which does not require any processing, such as development, fixing, lacquering, etc., subsequent to imagewise exposure.

These objects have been achieved by the present invention. That is, the present invention provides a process for preparing a lithographic printing plate which comprises imagewise exposing a lithographic printing plate material, comprising a support having thereon a lightsensitive layer comprising, as essential components, (a) an inorganic material and (b) at least one material selected from a metal and a metal compound, both of which are in a state in contact with each other, and which, upon irradiation with electromagnetic radiation, react with each other forming a mutually diffused state and, as a result, a difference in the hydrophilic property or in the oleophilic property occurs between the areas irradiated with electromagnetic radiation and the non-irradiated areas, to electromagnetic radiation, and then wetting the light-sensitive layer with a wetting solution containing (i) at least one compound selected from the group consisting of thiourea and a thiourea derivative and (ii) as an acid component, at least one compound selected from the group consisting of an inorganic acid, an acidic inorganic salt and an organic acid.

DETAILED DESCRIPTION OF THE INVENTION

The present invention is described in greater detail below.

Suitable base plates which can be used as a support for the lithographic printing plate material used in this invention are those having a hydrophilic surface and having an adequate degree of rigidity. Suitable examples include all of those supports that have been employed as base plates for conventional lithographic printing plates and those which have the above-described characteristics. Typical examples of suitable base plates as supports are, for example, a metal plate, a synthetic resin sheet whose surface is rendered hydrophilic, a laminate of a metal plate or a metal foil and a synthetic resin sheet or paper sheet.

Aluminum plates and zinc plates are mainly employed, in general, as metal plates, but the so-called multi-laminate plates can also be employed. In using these metal plates, these metal plates are preferably grained in order to improve the water-retention properties and further to improve adhesion with a light-sensitive layer which is provided thereon. The surface of these metal plates can also be subjected to chemical and electrochemical treatments as employed with conventional presensitized (PS) plates, as is disclosed in, for example, U.S. Pat. No. 2,714,066, if desired. In particular, an aluminum oxide layer has been generally formed on the grained surface using anodic oxidation in the case of aluminum plates, and further by treating this surface with a suitable acid or alkali, the suitability of the plate as a lithographic printing plate can be further improved. Sulfuric acid, phosphoric acid, oxalic acid, or the like can be employed as electrolyte solutions to anodically oxidize aluminum plates. In addition, after an aluminum plate has been grained, the surface thereof can be subjected to porous chromium plating. The thus-obtained base plate can also be utilized in the present invention.

Typical examples of synthetic resin sheets, the surface of which has been rendered hydrophilic, which can be used include those obtained by saponifying the surface of a cellulose triacetate sheet and those obtained by forming a hydrophilic layer on the surface of a synthetic resin sheet such as a polyethylene terephthalate sheet, etc., by coating. Even when a metallic surface is utilized, the entire base plate need not necessarily be composed of a metal, but it is possible to partially substitute a suitable synthetic resin or paper therefor while maintaining the mechanical strength as a plate; or it is also possible to utilize a multiple sheet comprising a metallic layer having laminated thereon a synthetic resin sheet or a sheet of paper.

The lithographic printing plate in accordance with the present invention comprises such a base plate having thereon at least one light-sensitive layer comprising the following various components.

The first essential component (a) is an inorganic material and examples include chalcogenides, chalcogenide compositions and halides. Chalcogenides are compounds comprising a sulfur group element, i.e., S, Se and Te, and elements such as As, Sb, Bi, Ge, Sn, Pb, In, Cd, Cu, Au, Ag, Ti, Fe, Cr, Tl, Hg, Si, etc. Chalcogenide compositions which can be utilized in the present invention include compositions comprising M—SGE, M—SGE—X, M—SGE—X—Y, etc., wherein SGE represents a sulfur group element, M represents As, Sb, Bi, Ge, Sn, Pb, In, Cd, Cu, Au, Ag, Ti, Fe, Cr, Tl, Hg, or Si, and X and Y each is mainly a metal or a semimetal and is selected from the group consisting of Al, Sb, Si, Mg, Ti, V, Mn, Co, Ni, Ta, Mo, W, Sn, Zn, Pb, Bi, Ag, Cu, Pd, In, Se and Te, but is different from M. In addition, X and Y can also be a non-metal. Examples of non-metals for X and Y are O, P and halogens.

Representative examples of halides as inorganic materials which can be utilized in the present invention are compounds comprising halogen group elements, i.e., Cl, Br and I, and elements such as Cu, Ag, Zn, Cd, Hg, Tl, Pb, Sb, Bi, Ge, Sn, In, etc.

The second essential component (b) is a metal or a metallic compound. Specific examples of suitable metals which can be used are Ag, Cu, Ge, Zn, Cd, Au, Pb, Al, Ga, In, Sn, V, Se, Cr, Fe, Tl, Bi, Mg, Mn, Co, Ni, Sb, Te, Pd, and the like. Of these metals, Ag and Cu are particularly preferred.

The metal compound which can be employed as component (b) in this invention is a compound selected from the group consisting of (1) a sulfide of a metal of Group Ib, IIb, IVb, Vb, or VIII, preferably Group Ib, IVb or VIII, of the Periodic Table, such as $Ag_2S$, $Cu_2S$, PbS or FeS, those which are not the same as the inorganic material (a) used therewith;

(2) a halide of a metal of Group Ib, IVb, or VIb, preferably Group Ib or IVb, of the Periodic Table, such as AgCl, AgBr, AgI, CuCl, $CuCl_2$, CuBr, $CuBr_2$, PbCl or $PbCl_2$ (these halides are used when the inorganic material (a) is a sulfur group element or a chalcogenide composition); and (3) an oxide of a metal of Group IV, V or VI.

Halides of Ag, Cu or Pb and sulfides of Ag, Cu, Pb or Fe are particularly effective as metallic compounds.

As component (b) of this invention, the metals as described above are preferred in comparison with the metal compounds as described above since metals provide higher sensitivity in photodoping.

Suitable specific examples of components (a) and (b) described above are disclosed in U.S. Pat. Nos. 3,637,377–81, 3,637,383, 3,663,224, 3,650,743 and 3,707,372 and Japanese Patent Application (OPI) No. 10018/74.

The respective components described above are the essential components of the light-sensitive layer(s) in the lithographic printing plate material in accordance with the present invention, but it is possible to add thereto, as a component (c), organic compounds as disclosed in, for example, Japanese Patent Application (OPI) No. 15703/77 (corresponding to U.S. patent application Ser. No. 709,744, filed July 29, 1967) now abandoned, inter alia, organic compounds employed in light-sensitive layers of silver salt photographic materials, additives such as antifogging agents, desensitizers, sensitizers, dyes, etc., and further to add organic photochromic substances thereto.

Examples of suitable organic compounds which can be used as component (c) are shown below.

I. Benzotriazole

II. Alkylene oxide polymers (1) $HO(R—O)_nH$
(R=ethylene, propylene, butylene, etc.;
n=10 to 10,000);

III. Carboxylic acids (1) Lower unsaturated carboxylic acids e.g., maleic acid, fumaric acid, cinnamic acid, etc.; e.g., maleic acid, fumaric acid, cinnamic acid, etc.;

(2) EDTA (i.e., ethylenediaminetetraacetic acid)

IV Phenols (1) Phenol and its derivatives

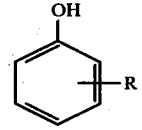

(R=H, methyl, ethyl, COOR' (R'=methyl, ethyl) e.g., phenol, methyl-p-hydroxybenzoate, etc.;

(2) Polyhydric phenols

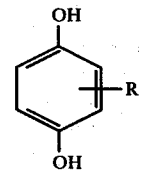

(R=H, and alkyl group having 1 to 18 carbon atoms) e.g., hydroquinone, methylhydroquinone, propylhydroquinone, 2,5-di(1,1-dimethylbutyl)hydroquinone, etc.;

V. Amines and hydrazines (1) Aliphatic amines

NH$_2$(RNH)$_n$RNH$_2$ (R=an alkylene chain having 1 to 6 carbon atoms; n=1−3) e.g., 3-azatetramethylenediamine, etc.;

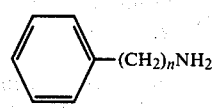

(n=1 to 20) e.g., β-phenylethylamine, γ-phenylpropylamine, etc.;

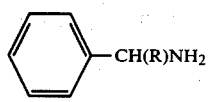

(R=an alkyl group having 1 to 5 carbon atoms) e.g., 1-phenylpropylamine, 1-phenylbutylamine, etc.;

(2) Aromatic amines, e.g., those compounds containing two or more amino groups on one benzene ring, for example, benzidine, chloramine, Metol;

(3) Hydrazines

VI. Compounds containing a —CO—NH group e.g., phthalimide, saccharin, salicylamide, acetylated compounds of aminophenol, etc.;

VII. Sulfur containing organic compounds

Organic compounds having at least one of an —SH group, a >C=S group, an —(S)$_n$— group wherein n=1 to 6, an —SO$_2$H group or an —SO$_3$H group, (1) Thioureas represented by the following formula:

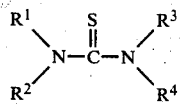

(R$^1$-R$^4$=H, an alkyl group or hydroxyalkyl group having 1 to 5 carbon atoms, a phenyl group; wherein R$^1$ and R$^2$ or R$^3$ and R$^4$ may be bonded to form a 5-membered heterocyclic ring such as pyrrolidine) e.g., thiourea, ethylenethiourea, trimethylthiourea, N,N'-dimethylolthiourea, etc.;

(2) Thiosemicarbazides and thiocarbazides represented by the following formulae:

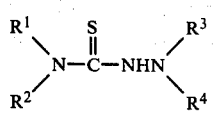

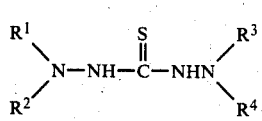

(R$^1$-R$^4$=H, an alkyl group having 1 to 5 carbon atoms, a phenyl group) and derivatives thereof, e.g., thiosemicarbazide, 4-phenylthiosemicarbazide, dithizone, thiocarbazide, etc.;

(3) Sulfides or polysulfides represented by the following formula:

R$^1$—(S)$_n$—R$^2$ (R$^1$, R$^2$=an alkyl group having 1 to 30 carbon atoms, a phenyl group, a naphthyl group; wherein such groups may be substituted with a carboxyl group, a nitro group, an —NH$_2$ group, a formylalkylamino group having 1 to 3 carbon atoms, etc.; n=1 to 6) e.g., 4,4'-thiodibenzoic acid, diformylmethyldisulfide, etc.;

(4) Sulfinic acids or sulfuric acids represented by the following formulae:

R—SO$_2$H

R—SO$_3$H (R=an alkyl group having 1 to 5 carbon atoms, a phenyl group) e.g., benzenesulfinic acid, benzenesulfonic acid, 2-butanesulfinic acid, etc.;

(5) Dithiocarbamic acids represented by the following formula:

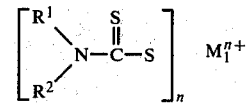

(R$^1$, R$^2$=H, an alkyl group having 1 to 5 carbon atoms, an aralkyl group having 7 to 9 carbon atoms, a phenyl group; M$_1$=H, an n valent metal ion; n=1 to 2) e.g., sodium diethyl dithiocarbamate, silver diethyl dithiocarbamate, zinc dibenzyl dithiocarbamate, etc.;

(6) Thiobenzophenone represented by the following formula:

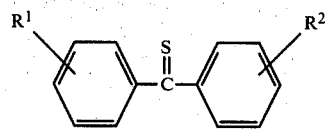

(R$^1$, R$^2$=H, an alkyl group having 1 to 5 carbon atoms, an alkoxy group having 1 to 5 carbon atoms, an amino group substituted with two alkyl groups which may each have 1 to 5 carbon atoms, Cl, Br, I) e.g., N,N,N',N'-tetramethyl-4,4'-diaminothiobenzophenone (thio Michler's ketone), etc.; (7) Compounds containing a 5-membered ring or a derivative thereof having a sulfur atom as one member of the ring;

(a) Dithiolan (b) Thiazole or benzothiazole; which can be substituted with an alkyl group having 1 to 5 carbon atoms, an acetylthioacetamido group, an —NH$_2$ group and/or an —SH group, if desired; e.g., 1,3-thiazole, benzothiazole, 2-aminobenzothiazole, 2-[α-(acetylthio)acetamido]-benzothiazole, 2-mercaptobenzothiazole, 2-mercapto-6-methylbenzothiazole, etc.;

(c) Thiazoline, rhodanine, isorhodanine;

(d) Thiazolidine, 4-carboxy-thiazolidine;

(e) Thiadiazole, 2,5-dimercapto-1,3,4-thiadiazole, potassium-5-sulfido-2-thioxo-1,3,4-thiadiazoline; These sulfur containing 5-membered ring compounds may be unsubstituted. Of these, mercapto or thioether-substituted compounds are particularly preferred.

(8) Compounds substituted with an —SH group, an =S group or an —S—R group wherein R represents an alkyl or phenyl group having up to 20 carbon atoms, a phenyl group and the like;

(a) Pyrrole and benzopyrrole; which can be substituted with an alkyl group having 1 to 20 carbon atoms, a phenyl group, and/or an alkylcarbonyl group having 2 to 5 carbon atoms, if desired; e.g., 2-mercaptopyrrole, N-mercapto-2-acetyl-benzopyrrole, etc.;

(b) Imidazole and benzimidazole; which can be substituted with an alkyl group having 1 to 20 carbon atoms, an alkylamino group having 2 to 21 carbon atoms, and/or a phenyl group, if desired; e.g., 2-mercaptoimidazole, 2-mercaptobenzimidazole, 5-lauroamido-2-mercaptobenzimidazole, 2-undecyl-3-phenyl-4-mercaptoimidazole, 1-phenyl-2-mercaptoimidazole, etc.;

(c) Imidazoline e.g., 2-mercaptoimidazoline, 2-hexyldecylthioimidazoline hydrogen bromide salt, etc.;

(d) Pyrazole and pyrazolidine; which can be substituted with one or more carboxyl groups and/or benzoyl groups, if desired; e.g., 1-mercaptopyrazole, 1-mercaptopyrazole-3,5-dicarboxylic acid, 1-benzoyl-3-mercaptopyrazolidine, 1,2,-benzoylpyrazolidine-3-thione, etc.;

(e) Triazole and benztriazole; which can be substituted with one or two alkyl groups having 1 to 20 carbon atoms, a phenyl group and/or a phenyl group substituted with an alkylamino group having 2 to 20 carbon atoms, if desired; e.g., 2-mercapto-1,2,4-triazole, N-mercaptobenzotriazole, 3,4-dimethyl-5-mercapto-1,2,4-triazole, 3-methyl-4-phenyl-5-mercaptotriazole, 3-mercapto-4-phenyl-1,2,4-triazole, 3-p-caproamidophenyl-4-ethyl-5-mercapto-1,2,4-triazole, 3-n-undecyl-4-phenyl-5-mercapto-1,2,4-triazole, etc.; Moreover, 1,5-dimercapto-3,7-diphenyl-[1,2,4]-triazolo-[1,2,a][1,2,4]-triazole can be used.

(f) Tetrazole; which can be substituted with one or two alkyl groups having 1 to 5 carbon atoms, a phenyl group, a phenyl group substituted with a benzamido group and/or an alkylamido group having 2 to 21 carbon atoms, if desired; e.g., 5-mercaptotetrazole, 1-phenyl-5-mercaptotetrazole, 1-(m-caproamidophenyl)-5-mercaptotetrazole, 1-(m-lauroamidophenyl)-5-mercaptotetrazole, 1-(m-benzamidophenyl)-5-mercaptotetrazole, etc.;

(g) Oxazole and benzoxazole; which can be substituted with one or two alkyl groups having 1 to 5 carbon atoms, or phenyl groups, if desired; e.g., 2-mercaptobenzoxazole, etc.;

(h) Pyridine; which can be substituted with one or two carboxyl groups, or sulfo groups; e.g., N-mercaptopyridine-2,3-dicarboxylic acid, N-mercaptopyridine-2-sulfonic acid, etc.;

(i) Quinoline, isoquinoline and 5,8-dioxyquinoline; which can be substituted with one or two carboxyl groups, if desired; e.g., 2-mercaptoquinoline, 2-mercaptoisoquinoline, 3-mercaptoquinoline-2,3-dicarboxylic acid, 2-mercapto-5,8-dioxyquinoline, etc.;

(j) Pyrimidine; which can be substituted with one or more alkyl groups having 1 to 5 carbon atoms, or an oxo group, if desired; e.g., 2-mercaptopyrimidine, 2-mercapto-4-methyl-6-oxo pyrimidine, thiobarbituric acid, 2-ethylthio-4-methyl-6-oxopyrimidine, etc.;

(k) Morpholine; which can be substituted with a benzoyl group, if desired; e.g., 2-mercaptomorpholine, 2-mercapto-N-benzoylmorpholine, etc.;

(l) Purine and caffeine; e.g., 2-mercaptopurine, 2-mercaptocaffeine, etc.;

(m) Tetrazaindene; which can be substituted with an alkyl group having 1 to 3 carbon atoms or a hydroxyl group; e.g., 2-mercapto-4-hydroxy-6-methyl-1,3,3a,7-tetrazaindene, etc.; Compounds (a) to (m) above without substituents such as an —SH group, an =S group, an —S—R group wherein R has the same meaning as above can also be used as the organic compound.

VIII. Selenic acids

R—SeO$_2$H (R=an alkyl group having 1 to 5 carbon atoms, or a phenyl group) e.g., ethylselenic acid, benzeneselenic acid, etc.;

IX. Effective dyes (The CI number indicates the identification number in the *Color Index*, 3rd Ed., The Society of Dyers and Colorists, Bradford, Yorkshire (1971)).

(1) Azo dyes (those containing an —N=group)

(a) Acid dyes; e.g.,

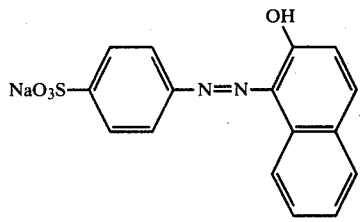

Orange II (CI 15510)

(b) Acid mordant dyes; e.g.,

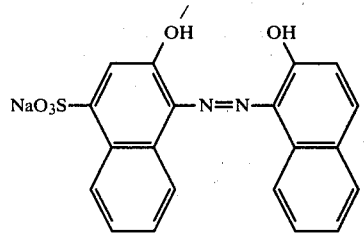

Chromium Blue Black RC (CI 15705)

(c) Direct dyes; e.g.,

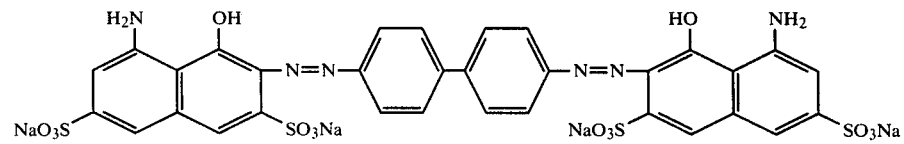

Direct Blue BB (CI 22610)

(d) Metal complex salt dyes; e.g.,

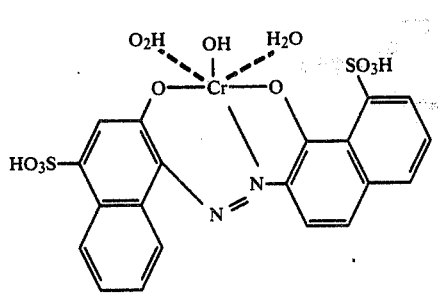

Palatine Fast Blue GGN (CI 14880)

(e) Basic dyes; e.g.,

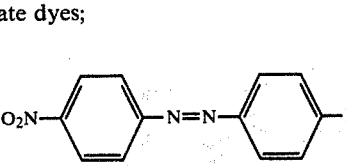

Chrysoidine (CI 11270)

(f) Acetate dyes;

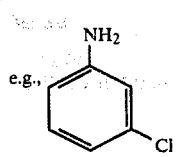

(g) Azoic dyes;
  (i) Fast color bases;

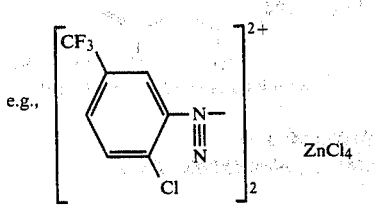

Fast Orange G Base (CI 37005)

(ii) Fast color salts;

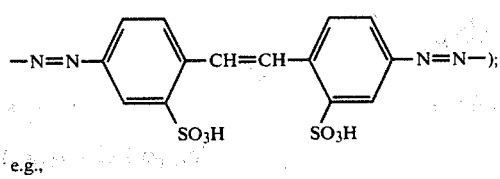

Fast Orange Salt RD (CI 37050)

(iii) Naphthols;

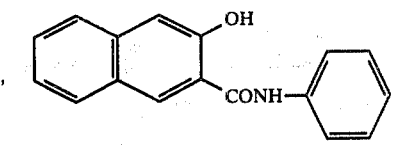

Napthol AS (CI 37505)

(iv) Rapid fast dyes;

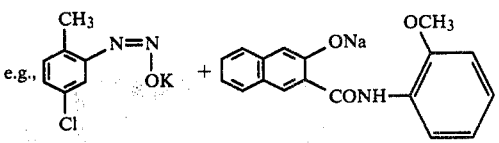

Rapid Fast Scarlet RH (CI 469)

(v) Rapidogen dyes; e.g.,

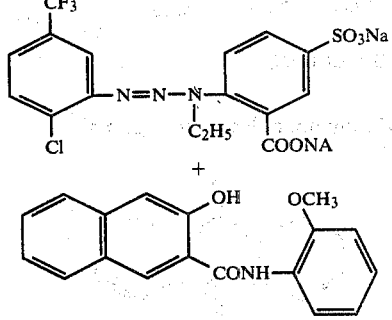

(h) Pyrazolone dyes (those containing

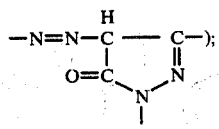

e.g.,

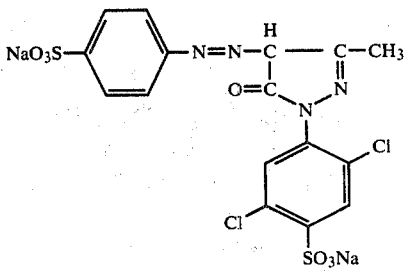

Xylene Fast Yellow 2 G (CI 18965)

(i) Stilbene dyes (those containing

-continued

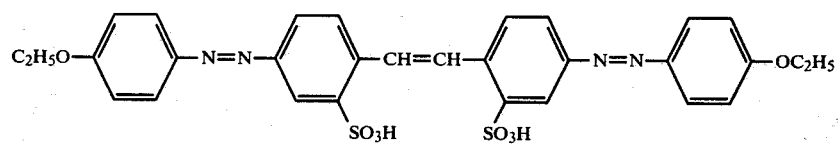
Chrysophenine G (CI 24895)

(j) Thiazole dyes (those containing

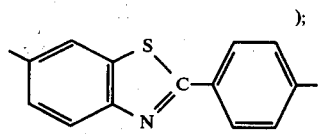

);

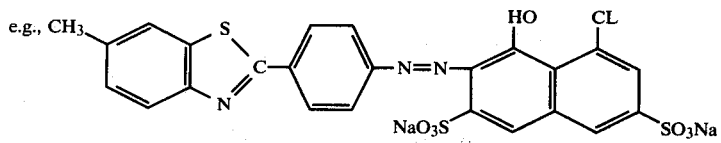
Diaminrosa BD (CI 15075)

(2) Anthraquinone dyes (those containing

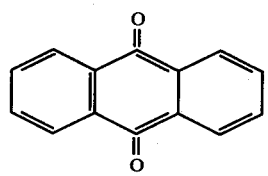
);

(a) Mordant dyes;

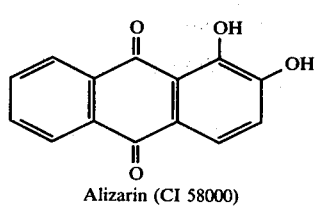
Alizarin (CI 58000)

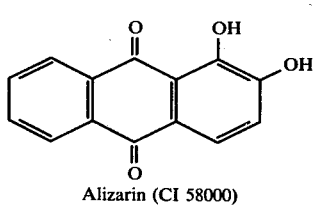
Alizarin (CI 58000)

(b) Acid mordant dyes; e.g.,

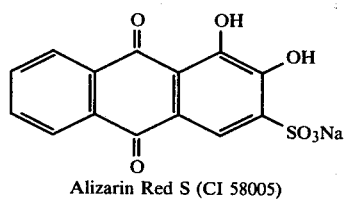
Alizarin Red S (CI 58005)

(c) Acid dyes; e.g.,

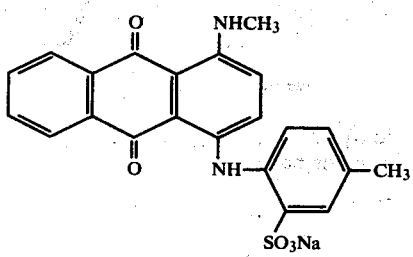
Alizarin Astral B (CI 61530)

(d) Acetate dyes; e.g.,

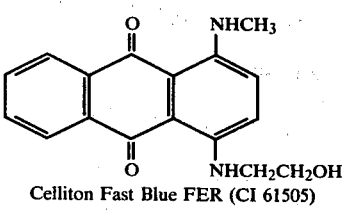
Celliton Fast Blue FER (CI 61505)

(e) Vat dyeing dyes
  (i) Anthraquinone type; e.g.,

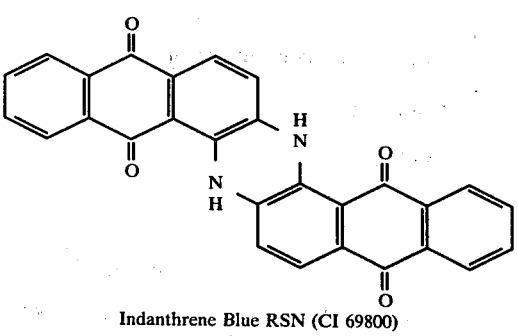
Indanthrene Blue RSN (CI 69800)

(ii) Anthrone type dyes; e.g.,

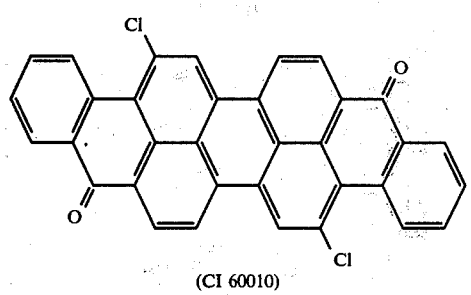
(CI 60010)
(3) Indigoid dyes (those containing
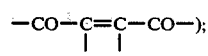
(a) Indigoids;
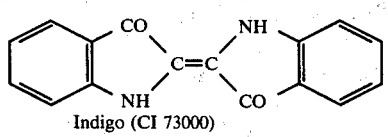
Indigo (CI 73000)
(b) Thioindigoids;
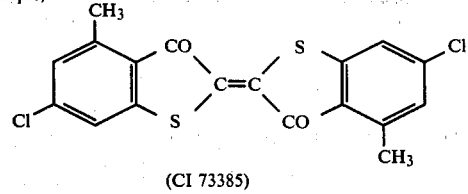
(CI 73385)
(4) Soluble vat dyeing dyes
(a) Indigoids; e.g.,
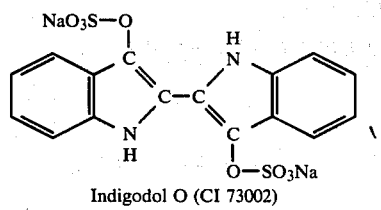
Indigodol O (CI 73002)
(b) Anthraquinoids; e.g.,
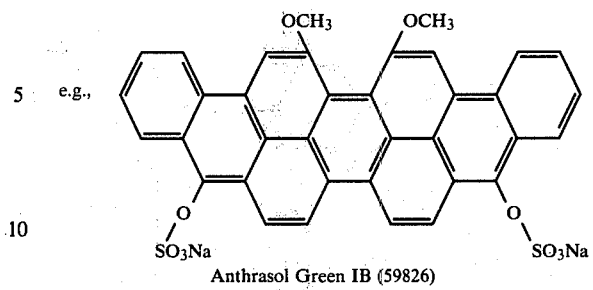
Anthrasol Green IB (59826)
(5) Sulfur dyes; e.g.,
(CI 53185)
(6) Carbonium dyes (those containing
(a) Diphenylmethane dyes (those containing e.g.,
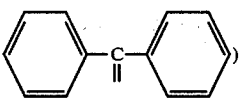
e.g., 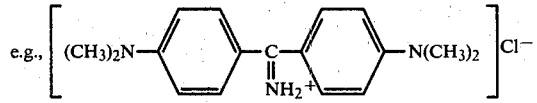
Auramine
(b) Triphenylmethane dyes (those containing
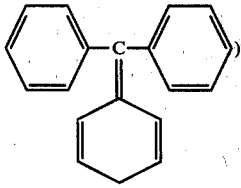
e.g., 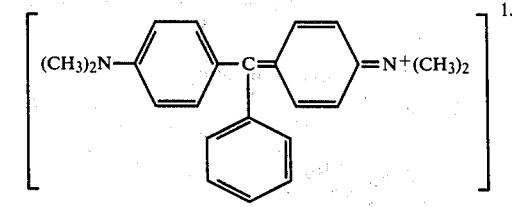
Oxalic acid salt
Malachite Green (CI 42000)

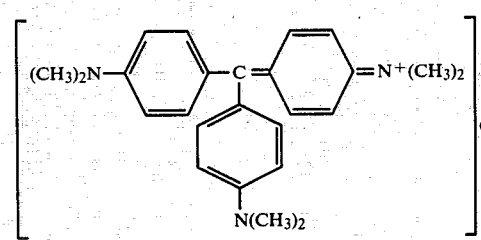

Crystal Violet (CI 42555)

(c) Xanthene dyes (those containing

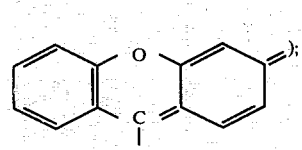

e.g.;
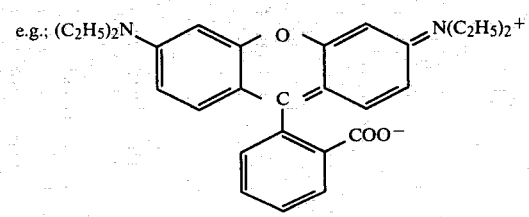

Rhodamine B (CI 45170)

(d) Acridine dyes (those containing

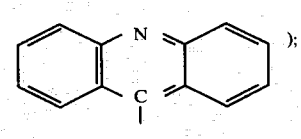

e.g.,
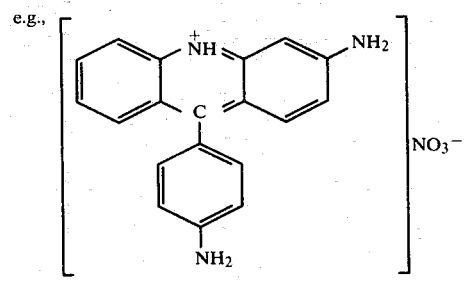

Phosphine (CI 46045)

(7) Quinoneimine dyes (those containing a >C=N—group)

(a) Azine dyes (those containing

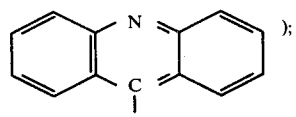

e.g.,
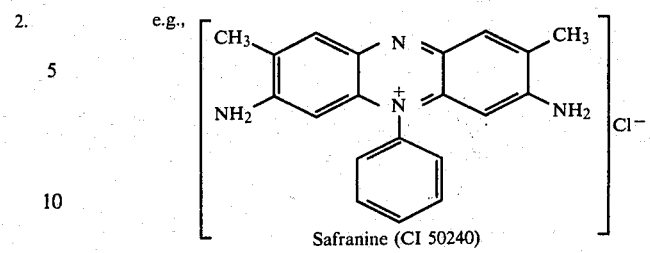

Safranine (CI 50240)

(b) Oxazine dyes (those containing

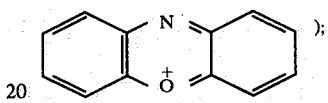

e.g.,
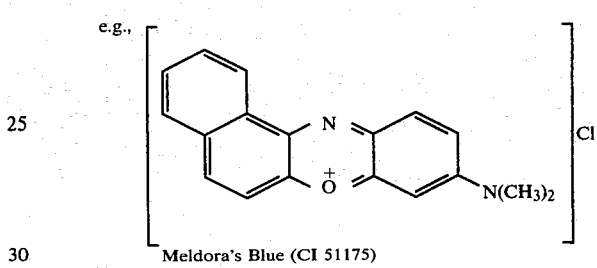

Meldora's Blue (CI 51175)

(c) Thiazine dyes (those containing

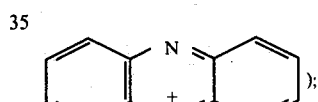

e.g.,
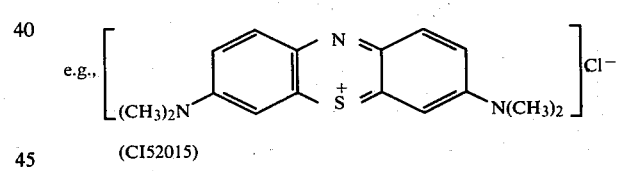

(CI52015)

(8) Phthalocyanine dyes (those containing

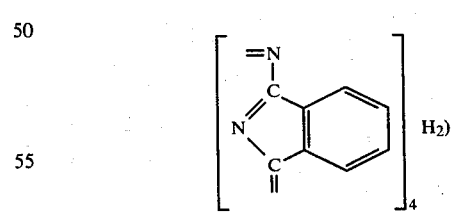

(9) Other dyes (a) Cyanine dyes (those containing $$\rangle N-C(=C-C)_n=N\langle\ );$$

(b) Quinoline dyes; e.g.,

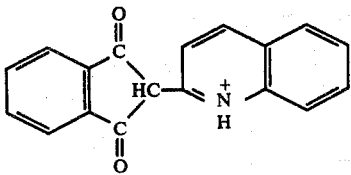

(c) Nitro dyes; e.g.,

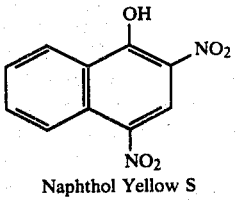

Naphthol Yellow S (d) Nitroso dyes; e.g.,

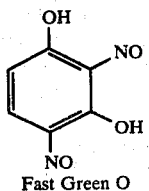

Fast Green O

X. Spiropyran compounds

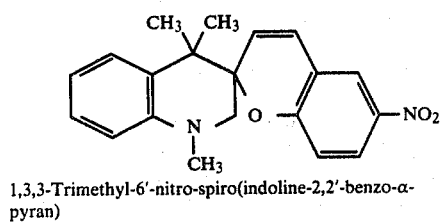

1,3,3-Trimethyl-6'-nitro-spiro(indoline-2,2'-benzo-α-pyran)   (1)

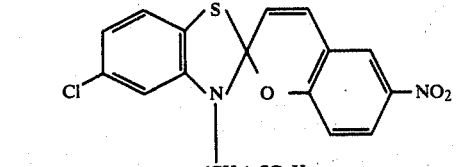

3-(3-Sulfopropyl)-5-chloro-6'-nitrospiro-(benzothiazoline-2,2'-benzo-α-pyran)   (2)

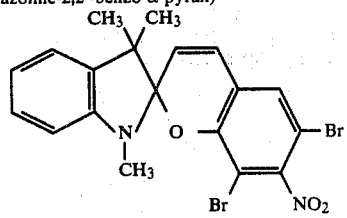

1,3,3-Trimethyl-6',8'-dibromo-7'-nitrospiro-(indoline-2,2'-benzo-α-pyran)   (3)

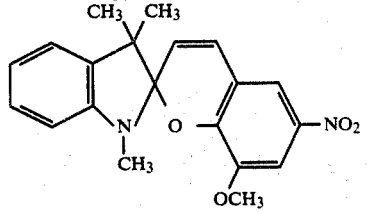

(4)

-continued 1,3,3-Trimethyl-6'-nitro-8'-methoxyspiro-(indoline-2,2'-benzo-α-pyran)

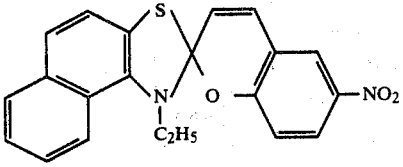

3-Ethyl-6'-nitrospiro(benzothiazoline-2,2'-benzo-α-pyran)   (5)

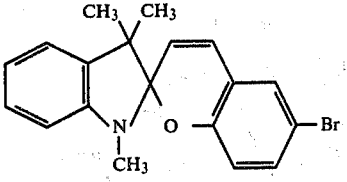

1,3,3-Trimethyl-6'-bromospiro(indoline-2,2'-benzo-α-pyran)   (6)

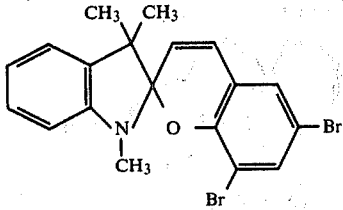

1,3,3-Trimethyl-6',8'-dibromospiro(indoline-2,2'-benzo-α-pyran)   (7)

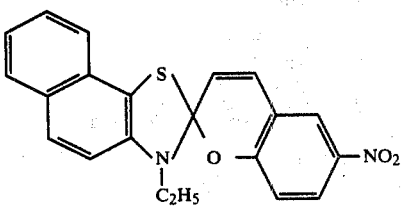

3-Ethyl-6'-nitrospiro(naphtho[2,1,d]thiazoline-2,2'-benzo-α-pyran)   (8)

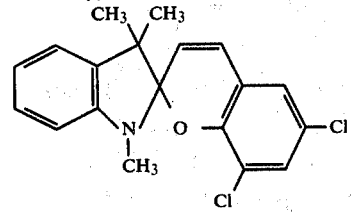

1,3,3-Trimethyl-6',8'-dichlorospiro(indoline-2,2'-benzo-α-pyran)   (9)

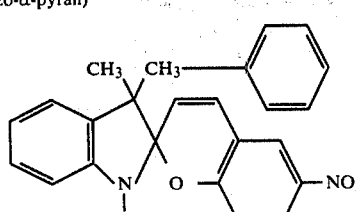

1,3-Dimethyl-3-benzyl-6'-nitrospiro(indoline-2,2'-benzo-α-pyran)   (10)

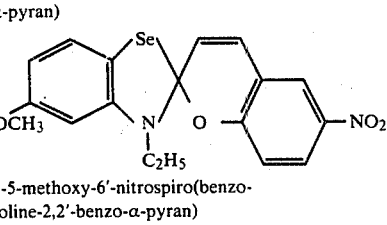

3-Ethyl-5-methoxy-6'-nitrospiro(benzoselenazoline-2,2'-benzo-α-pyran)   (11)

-continued

(12) 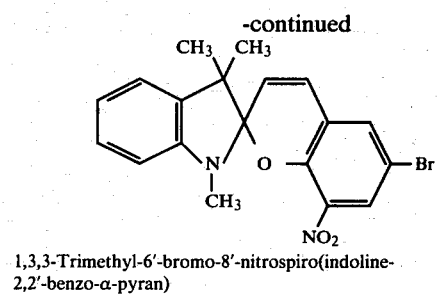

1,3,3-Trimethyl-6'-bromo-8'-nitrospiro(indoline-2,2'-benzo-α-pyran)

(13) 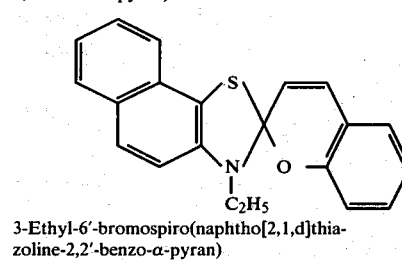

3-Ethyl-6'-bromospiro(naphtho[2,1,d]thiazoline-2,2'-benzo-α-pyran)

(14) 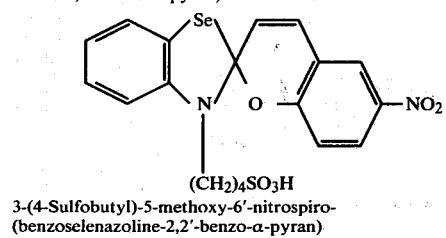

3-(4-Sulfobutyl)-5-methoxy-6'-nitrospiro-(benzoselenazoline-2,2'-benzo-α-pyran)

(15) 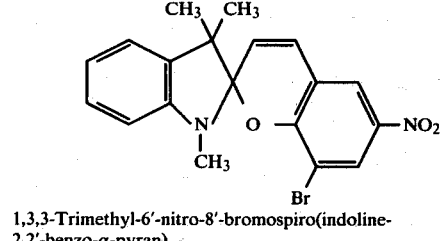

1,3,3-Trimethyl-6'-nitro-8'-bromospiro(indoline-2,2'-benzo-α-pyran)

(16) 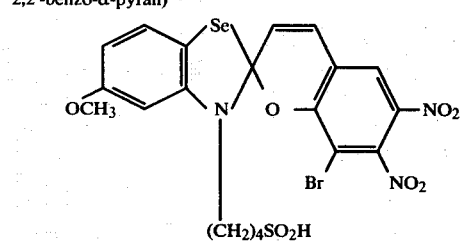

3-(4-Sulfobutyl)-5-methoxy-6',8'-dibromo-7'-nitrospiro(benzoselenazoline-2,2'-benzo-α-pyran)

(17) 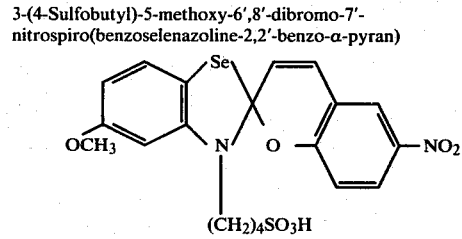

3-(3-Sulfopropyl)-5-methoxy-6'-nitrospiro-(benzoselenazoline-2,2'-benzo-α-pyran)

(18) 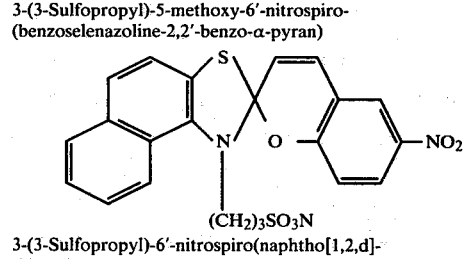

3-(3-Sulfopropyl)-6'-nitrospiro(naphtho[1,2,d]-thiazoline-2,2-benzo-α-pyran)

(19) 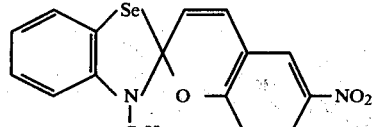

3-Ethyl-6'-nitrospiro(benzoselenazoline-2,2'-benzo-α-pyran)

Of the organic compounds described above, benzotriazole (I), sulfur containing organic compounds (VII), dyes (IX) and spiropyran compounds (X) are preferred. In particular, benzotriazole (I), sulfur containing organic compounds (VII) having an —SH group, a C=S group, more particularly, compounds (1), (2), (5), (6), (7) (a) (7)(b), (7)(d), (7)(e), (8)(b), (8)(c), (8)(e), (8)(f), (8)(j), and (8)(m) of (VII) and Methylene Blue, Crystal Violet and Rhodamine B of (VIII) can be preferably employed.

In order to form the light-sensitive layer(s) comprising these various components on the base plate described above to prepare the lithographic printing plate material which is used in the present invention, any one of a variety of conventional methods can be used, e.g., as described in, for example, U.S. Pat. Nos. 3,637,377–81, 3,637,383, 3,663,224, 3,650,743, 3,996,057 and 3,707,372 and Japanese Patent Applications (OPI) Nos. 10018/74 and 15703/77, to form desired light-sensitive layer(s). That is, suitable methods include vacuum deposition of the respective components in a ratio previously determined by which a light-sensitive layer having a desired composition is formed, after placing a selected base plate and the respective components in a vacuum deposition apparatus, simultaneously or in sequence; or, in lieu of vacuum deposition, sputtering or ion plating. Of these methods, a method for depositing the components on a base plate without a binder is particularly preferred. The details of these treatments are well known and, therefore, are not explained in great detail herein. However, they are all known techniques so that one skilled in the art can easily utilize the same to prepare the desired lithographic printing plate material.

It is necessary for the respective components to be in contact with each other in the light-sensitive layer. This is an essential requirement for causing the mutual diffusion later explained which occurs between the inorganic material and the metal or metallic compound. When the light-sensitive layer comprises components (a) and (b), each of components (a) and (b) may be deposited in the form of a layer so that the light-sensitive layer is in a laminate state, or components (a) and (b) may be deposited as a mixture in the form of fine particles (i.e., in a physically mixed state) as described in Japanese Patent Application No. 33790/74 (corresponding to U.S. patent application Ser. No. 776,699, now U.S. Pat. No. 4,115,127, filed Mar. 11, 1977). Alternatively, when the light-sensitive layer comprises components (a), (b) and (c), two of components (a), (b) and (c) may be deposited in the form of layers and the remaining component is deposited therebetween in the form of fine particles; one of components (a), (b) and (c) may be deposited in the form of layer and the remaining two components, either previously have been deposited thereunder or are subsequently deposited thereon in a physically mixed state; or all of components (a), (b) and (c) may be deposited in a physically mixed state. Thus, mutual contact of (a) and (b) or (a), (b) and (c) can be attained. Conventional methods for forming the light-sensitive layer can be used. The amount of each component deposited will vary depending on whether each component is deposited in the form of a layer or as fine particles, and a suitable amount of each component to be deposited can easily be determined by routine testing. In general, components (a), (b) and (c) are deposited in amounts ranging from about 0.1 to about 10 $\mu g/cm^2$, from about 0.1 to about 30 $\mu g/cm^2$ and from about 0.1 to about 3 $\mu g/cm^2$, respectively.

The present invention provides a process for preparing a lithographic printing plate by subjecting the lithographic printing plate materials as described above to a specific treatment for preparing a printing plate. In the process for preparing a printing plate, the light-sensitive layer of the lithographic printing plate material is imagewise irradiated with electromagnetic radiation and thereafter the light-sensitive layer is wet with a wetting solution containing (i) at least one of thiourea and a thiourea derivative and (ii) as an acid component, at least one of an inorganic acid, an acidic inorganic salt and an organic acid. Known techniques for imagewise irradiation with the electromagnetic radiation, which is the first step in the process for preparing a printing plate, can be used. For example, the irradiation can be performed, after placing an image mask on the light-sensitive layer of the material, using electromagnetic radiation such as visible light or ultraviolet light through the image mask, or by scanning the light-sensitive layer with electromagnetic radiation beams. As a result, diffusion occurs due to a mutual reaction between the inorganic material and the metal or metallic compound described above and, thus, a change in the hydrophilic property or oleophilic property is thereby caused, from that of the original state where no electromagnetic radiation has been irradiated. In this type of lithographic printing material, the material obtained by preparing a printing plate in this manner has been heretofore employed practically as a printing plate. In the present invention, a wetting solution containing at least one of the thiourea and a thiourea derivative and at least one acid component is subsequently applied to the surface of the thus-prepared printing plate. As a result, the drawbacks occurring with conventional lithographic printing plates are eliminated and the characteristics thereof are improved. Suitable light sources which can be used for exposure include a xenon lamp, sunlight, a flash lamp, a mercury lamp, a carbon arc lamp, a tungsten lamp and electron beams can be employed. The exposure time will vary depending upon the kind of light source used, the light intensity, the thickness of the light-sensitive layer, etc., but such generally ranges from about 0.1 second to about 60 minutes, preferably from about 30 seconds to about 20 minutes.

The wetting solution, which is an important feature of the present invention, comprises, as described above, an aqueous solution containing (i) at least one compound selected from the group consisting of thiourea and a thiourea derivative and (ii) as an acid component, at least one member selected from the group consisting of an inorganic acid, an acidic inorganic salt and an organic acid.

The thiourea and the thiourea derivative are compounds represented by the formula (I):

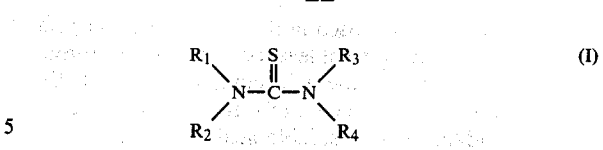

wherein $R_1$, $R_2$, $R_3$ and $R_4$, which may be the same or different, each represents a hydrogen atom; an alkyl group having 1 to 20 carbon atoms which may be substituted with one or more of a hydroxy group or an amido group; an alkenyl group having 2 to 20 carbon atoms; an alkynyl group having 2 to 20 carbon atoms; an aralkyl group having 7 to 20 carbon atoms; an alicyclic group having 6 to 20 carbon atoms; an aryl group having 6 to 20 carbon atoms which may be substituted with one or more of a hydroxy group or a lower alkyl group having 1 to 4 carbon atoms; an amino group which may be substituted with one or more of a phenyl group or a lower alkyl group having 1 to 4 carbon atoms; or an acyl group having 2 to 10 carbon atoms; and $R_1$ and $R_3$ or $R_2$ and $R_4$ may combine to form a divalent saturated aliphatic carbon chain which may be substituted with a hydroxy group.

Specific examples of compounds represented by the formula (I) are thiourea, N-methylthiourea, N-ethylthiourea, N-heptadecylthiourea, N,N-dimethylthiourea, N,N'-diethyl thiourea, N,N,N'-triethylthiourea, N,N,N',N'-tetramethylthiourea, N-allylthiourea, N-ethynylthiourea, N-benzylthiourea, N-phenylethylthiourea, N-cyclohexylthiourea, N,N'-dimethylolthiourea, N-ethyl-N'-ethylolthiourea, N-phenylthiourea, N-tolylthiourea, N,N'-diphenylthiourea, ethylenethiourea, pinacolylthiourea, N-amino-N'-ethylthiourea, N-anilino-N',N'-dimethylthiourea, N,N-diethyl-N'-acetylthiourea, etc.

The acid component present in the wetting solution used in the present invention includes inorganic acids such as hydrochloric acid, sulfuric acid, nitric acid, phosphoric acid, boric acid, etc., acidic inorganic salts such as ammonium chloride, ammonium phosphate, etc., and organic acids such as sulfonic acids, sulfinic acids, carboxylic acids, barbituric acids, uric acids, etc. Suitable sulfonic acids include those having 1 to 10 carbon atoms, e.g., methanesulfonic acid, benzenesulfonic acid, p-toluenesulfonic acid, naphthalene-α-sulfonic acid, etc. Suitable sulfinic acids include those having 1 to 10 carbon atoms, e.g., benzenesulfinic acid, p-toluenesulfinic acid, etc. Of these sulfinic acids, aromatic sulfinic acids are particularly preferred. Suitable carboxylic acids are those having 1 to 20 carbon atoms such as monocarboxylic acids, e.g., formic acid, acetic acid, lauric acid, behenic acid, benzoic acid, isobutyric acid, trimethylacetic acid, phenylacetic acid, acrylic acid, vinylacetic acid, oleic acid, etc., dicarboxylic acids, e.g., oxalic acid, malonic acid, succinic acid, adipic acid, phthalic acid, terephthalic acid, maleic acid, etc.; polycarboxylic acids, e.g., pyromellitic acid, etc.; halogenated carboxylic acids, e.g., fluoroacetic acid, chloroacetic acid, etc.; and hydroxycarboxylic acids, e.g., lactic acid, malic acid, tartaric acid, citric acid, salicylic acid, p-hydroxybenzoic acid, gallic acid, etc. Of these organic acids set forth above, carboxylic acids are particularly preferred. Further, of the acid component set forth above, water-soluble compounds are particularly preferred as the acid component of the wetting solution.

The wetting solution used in the present invention is prepared by dissolving (i) at least one of these thioureas and (ii) at least one of the acid components set forth above in water, or in the case of using water-insoluble thioureas and/or water-insoluble acid components, by previously forming a solution thereof using an organic solvent which is miscible with water and then mixing the resulting solution with water, etc. A suitable concentration of the thioureas and the acid component is about 0.1 to about 30% by weight and about 0.01 to about 20% by weight, preferably 1 to 5% by weight and 0.05 to 5% by weight, based on the total amount of the wetting solution, respectively.

Examples of suitable organic solvents which can be used include alcohols such as methanol, ethanol, propanol, etc.; acetone; glycerin; glycols such as ethylene glycol; carboxylic acids such as acetic acid, propionic acid; amines such as ethanolamine, diethanolamine, triethanolamine, etc.; dioxanes, dimethylformamide, tetrahydrofuran, morpholine, and the like. The amount of the organic solvent used with the water is not critical and the organic solvent can be added in an amount sufficient to dissolve the thiourea and/or thiourea derivatives and/or the acid component. However, organic solvents are preferably employed in an amount as small as is possible.

Other additives which can be incorporated in the wetting solution, e.g., in an amount of less than 50% by weight based on the total weight of the wetting solution, include hydrophilic high molecular weight materials which have been heretofore employed as components of a wetting solution, such as gum arabic, sodium alginate, polyvinyl alcohol, carboxymethyl cellulose, polyvinylpyrrolidone, methyl cellulose, dextrin, etc. Appropriate additives can be selected and added to the wetting solution used in the present invention. The purposes of the addition of these components, i.e., the functions of respective components, are not completely clear, but it is believed that the hydrophilic high molecular weight materials improve the water-retention on the surface of the printing plate. Salts can be used to buffer the solution maintaining the pH of wetting solution at a definite pH.

The wetting solution thus-prepared is applied to the above-described lithographic printing plate as in the case of printing using conventional lithographic printing plates. For example, water-absorbing materials such as a sponge, a cloth, etc., are impregnated with the wetting solution, followed by softly rubbing the surface of the printing plate with it. Alternatively, a wetting solution is charged into a wetting-water-bath in a lithographic printer and the wetting solution is coated on the printing plate via a roller. The method for applying the wetting solution to the surface of a printing plate is quite the same as that used in conventional methods. However, when the treatment with this wetting solution is performed after exposure followed by inking thereafter using a printer, the effects of the present invention can be maintained even after printing many times, even if printing is performed using ordinary wetting solutions.

According to the present invention, the difference in the oleophilic property or hydrophilic property on the surface of a conventional lithographic printing plate can be remarkably increased, and excellent printability as well as durability are obtained. Further, excellent stability is obtained. Hence, the present invention provides a valuable printing technique.

The following examples are given to illustrate the present invention in greater detail. Unless otherwise indicated herein, all parts, percents, ratios and the like are by weight.

EXAMPLE 1

In an alumina-coated tungsten basket, which was positioned in a vacuum deposition apparatus, was charged 300 mg of $GeS_{2.5}$ (hereinafter the numerical subscripts represent the atomic ratio), which was obtained by melting and mixing Ge and sulfur having purities of 99.999% in a vacuum and then quenching the mixture, as an evaporation source. After an aluminum plate of a size of 300 mm × 400 mm, which had been grained and anodically oxidized, was arranged in the form of an arc at a distance of about 30 cm from the evaporation source in the vacuum evaporation apparatus, vacuum evaporation was performed under a vacuum degree of $5 \times 10^{-5}$ Torr, until the amount of these inorganic materials adhered reached 30 $\mu g/cm^2$. Thereafter, 100 mg of silver having a purity of 99.99% was charged in the basket described above and then vacuum evaporation was conducted until the amount of silver adhered reached 5.0 $\mu g/cm^2$. Thus, a lithographic printing plate material sample was prepared.

The adhered amounts described above were not actually measured, but were determined using a monitor (DTM-200 Model Monitor, made by Sloan Co., Ltd., U.S.A.) which was connected with the vacuum evaporation apparatus. Amounts adhered hereinafter were determined in the same manner.

A positive exposure mask was placed on the evaporated surface of the printing plate material sample, exposure was performed for 1 minute using an exposure apparatus, PS Light (PS Light (output, 2 kw), exposure apparatus made by the Fuji Photo Film Co., Ltd.; hereinafter "PS Light") to thereby form a clear positive image (posi image). Then, the sample which had not been subjected to any subsequent treatment was inserted in a lithographic printer, "Hamadastar 600 CD" (lithographic printer, made by Hamada Printer Mfg. Co.; hereinafter "Hamadastar 600 CD"). After the printing plate was wetted with Wetting Solution (1) having the composition indicated below,

| Wetting Solution (1) | |
|---|---|
| Thiourea | 2 g |
| Phosphoric Acid | 2 ml |
| Water to make | 100 ml | inking was performed to obtain a lithographic printing plate inked in a negative type. Using the thus-obtained printing plate, 1,000 prints could be obtained.

On the other hand, a lithographic plate material sample prepared in the same manner as described above was inserted in a lithographic printer without any subsequent treatment. After the printing surface was wetted with wetting solution obtained by diluting EU-1 (etching solution for a PS plate, made by the Fuji Photo Film Co., Ltd.) 32 times, inking of the plate was performed. The printing plate was inked in a positive type, but the non-line image areas were somewhat easily contaminated and the inking amount at the line image areas was insufficient.

EXAMPLE 2

In a manner similar to that described in Example 1, 20 μg/cm² of silver, and then 10 μg/cm² of $As_2S_3$, and finally 0.5 μg/cm² of 1-phenyl-5-mercaptotetrazole were deposited on a grained aluminum plate as described in Example 1 to prepare a lithographic printing plate material. After exposing the plate to light for 1 minute using a PS Light, the printing plate was inserted in a lithographic printer without subjecting the plate to any additional treatment. Then, after the surface of the printing plate was wetted with Wetting Solution (2) having the composition shown below,

| Wetting Solution (2) | |
| --- | --- |
| N-Ethylthiourea | 2 g |
| Sulfuric Acid | 2 ml |
| Water to make | 100 ml | inking was performed so that a lithographic printing plate which was inked in a positive type was obtained. 500 prints could be obtained.

EXAMPLE 3

In a manner similar to that described in Example 1, 30 μg/cm² of a chalcogenide glass of a composition of $(GeS_3)_{70}(Sb_2S_3)_{30}$ and then 4.0 μg/cm² of silver were deposited on a grained and anodically oxidized aluminum plate as described in Example 1.

Thereafter, a 10% aqueous gum arabic solution was coated on the printing surface using a Planocellulose sponge (sponge for preparing a printing plate, made by the Fuji Photo Film Co., Ltd.), followed by drying at 120° C. for 2 minutes. After exposing this lithographic printing plate material to light for 1 minute using a PS Light, the printing plate was inserted in a lithographic printer without subjecting the plate to any additional treatment. Then, after the printing surface was wetted using Wetting Solution (3) having the composition shown below,

| Wetting Solution (3) | |
| --- | --- |
| Ethylenethiourea | 2 g |
| Tartaric Acid | 0.5 g |
| Ethyl Alcohol | 20 ml |
| Water to make | 100 ml | inking was performed to obtain a lithographic printing plate inked in a negative type. 1,000 prints could be obtained.

On the other hand, a lithographic printing plate sample prepared in a manner similar to that described above was inserted in a lithographic printer. After the printing surface was wetted with a wetting solution obtained by diluting EU-1 32 times by adding water thereto, inking was performed. The printing plate was inked in a positive type, but the oleophilic sensitivity at the line image areas was poor so that inking was insufficient.

EXAMPLE 4

In a manner similar to that described in Example 1, 20 μg/cm² of a chalcogenide glass of the composition of $(GeS_4)_{60}(Sb_2S_3)_{40}$, then 5.0 μg/cm² of silver and then 0.2 μg/cm² of 2-mercapto-5-lauroamidoimidazole were deposited on a grained and anodically oxidized aluminum plate as described in Example 1. After exposing this lithographic printing plate material to light for 1 minute using a PS Light, the printing plate material was inserted in a lithographic printer without subjecting such to any additional treatment. Then, after the printing surface was wetted with Wetting Solution (4) having the composition shown below

| Wetting Solution (4) | |
| --- | --- |
| Thiourea | 2 g |
| Benzoic Acid | 0.5 g |
| Gum Arabic | 0.1 g |
| Ethyl Alcohol | 50 ml |
| Water to make | 100 ml | inking was performed to obtain a lithographic printing plate inked in a negative type. 5000 prints were obtained.

EXAMPLE 5

In a manner similar to that described in Example 1, 10 μg/cm² of copper, and then 10 μg/cm² of a chalcogenide glass having a composition of $(GeS_{2.5})_{80}(Sb_2S_3)_{20}$ were evaporated on a grained and anodically oxidized aluminum plate as described in Example 1. After exposing this lithographic printing plate material to light for 1 minute using a PS Light, the printing plate material was inserted into a lithographic printer without subjecting such to any additional treatment. Then, after the printing surface was wetted with Wetting Solution (5) having the composition shown below,

| Wetting Solution (5) | |
| --- | --- |
| N-Phenylthiourea | 2 g |
| Pyromellitic Acid | 0.5 g |
| Gum Arabic | 0.1 g |
| Benzyl Alcohol | 20 ml |
| Water to make | 100 ml | inking was performed to obtain a lithographic printing plate inked in a positive type. 500 prints were obtained.

EXAMPLE 6

In a manner similar to that described in Example 1, 30 μg/cm² of a chalcogenide glass having a composition of $(GeS_5)_{50}(Sb_2S_3)_{50}$ and then 4.0 μg/cm² of silver were deposited on a grained and anodically oxidized aluminum plate as described in Example 1. Then, a solution of 1 g of benzotriazole in 100 ml of a 10% aqueous gum arabic solution was prepared. The solution was coated on the printing surface with a sponge, followed by drying at 120° C. for 2 minutes. After exposing this lithographic printing plate material to light for 1 minute using a PS Light, the printing plate material was inserted in a lithographic printer without subjecting it to any additional treatment. Then, after the printing surface was wetted with Wetting Solution (6) having the composition shown below,

| Wetting Solution (6) | |
| --- | --- |
| Thiourea | 4 g |
| Citric Acid | 0.5 g |
| Castor Oil | 0.5 g |
| Water to make | 100 ml | inking was performed to obtain a lithographic printing plate inked in a negative type. 5000 prints were obtained.

What is claimed is:

1. A process for preparing a lithographic printing plate which comprises imagewise exposing a lithographic printing plate material comprising a support having thereon a light-sensitive layer comprising, as essential components, (a) an inorganic material selected from the group consisting of a chalcogenide, a chalcogenide composition, and a halide, and (b) at least one member selected from the group consisting of a metal, a metal oxide, a metal halide when (a) is a sulfur group element or a chalcogenide composition, and a metal sulfide which is not the same as the inorganic material (a), with both of the inorganic material (a) and the metal or metal compound (b) being in a state of contact with each other, and which, upon irradiation with said electromagnetic radiation, react with each other to form a mutually diffused state and, as a result, a difference in the hydrophilic property or in the oleophilic property occurs between the areas irradiated with said electromagnetic radiation and the non-irradiated areas, to electromagnetic radiation, and then wetting the light-sensitive layer with a wetting solution containing (i) at least one compound selected from the group consisting of thiourea and a thiourea derivative and (ii) as an acid component, at least one compound selected from the group consisting of an inorganic acid, an acidic inorganic salt and an organic acid.

2. The process for preparing a lithographic printing plate as claimed in claim 1, wherein said lithographic printing plate material includes (c) at least one organic material capable of influencing said mutual reaction in said light-sensitive layer or on said light-sensitive layer.

3. The process for preparing a lithographic printing plate as claimed in claim 1, wherein said thiourea and thiourea derivative (i) is represented by the formula (I):

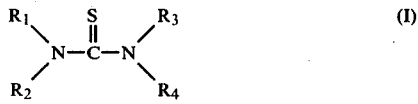

wherein $R_1$, $R_2$, $R_3$ and $R_4$, which may be the same or different, each represents a hydrogen atom; an alkyl group which may be substituted with one or more of a hydroxy group and an amido group; an alkenyl group; an alkynyl group; an aralkyl group; an alicyclic group; an aryl group which may be substituted with one or more of a hydroxy group and an alkyl group having 1 to 4 carbon atoms; an amino group which may be substituted with one or more of a phenyl group and an alkyl group having 1 to 4 carbon atoms; or an acyl group and $R_1$ and $R_3$ or $R_2$ and $R_4$ may combine to form a divalent saturated aliphatic carbon chain which may be substituted with a hydroxy group.

4. The process for preparing a lithographic printing plate as claimed in claim 3, wherein said thiourea derivative is N-methylthiourea, N-ethylthiourea, N-heptadecylthiourea, N,N-dimethylthiourea, N,N'-diethylthiourea, N,N,N'-triethylthiourea, N,N,N',N'-tetramethylthiourea, N-allylthiourea, N-ethylthiourea, N-benzylthiourea, N-phenylethylthiourea, N-cyclohexylthiourea, N,N'-dimethylolthiourea, N-ethyl-N'-ethylolthiourea, N-phenylthiourea, N-tolylthiourea, N,N'-diphenylthiourea, ethylenethiourea, pinacolylthiourea, N-amino-N'-ethylthiourea, N-anilino-N',N'-dimethylthiourea, or N,N-diethyl-N'-acetylthiourea.

5. The process for preparing a lithographic printing plate as claimed in claim 1, wherein said thiourea or thiourea derivative (i) is present in said wetting solution in an amount of about 0.1 to about 30% by weight and said acid component (ii) is present in said wetting solution in an amount of about 0.01 to about 20% by weight, each based on the total weight of said wetting solution.

6. The process for preparing a lithographic printing plate as claimed in claim 1, wherein said organic acid is a sulfonic acid having 1 to 10 carbon atoms, a sulfinic acid having 1 to 10 carbon atoms or a carboxylic acid having 1 to 20 carbon atoms.

7. The process for preparing a lithographic printing plate as claimed in claim 1, wherein said inorganic acid is hydrochloric acid, sulfuric acid, nitric acid, phosphoric acid or boric acid, said acidic inorganic salt is ammonium chloride or ammonium phosphate and said organic acid is methanesulfonic acid, benzenesulfonic acid, p-toluenesulfonic acid, naphthalene-α-sulfonic acid, benzenesulfinic acid, p-toluenesulfinic acid, formic acid, acetic acid, lauric acid, behenic acid, benzoic acid, isobutyric acid, trimethylacetic acid, phenylacetic acid, acrylic acid, vinylacetic acid, oleic acid, oxalic acid, malonic acid, succinic acid, adipic acid, phthalic acid, terephthalic acid, maleic acid, pyromellitic acid, fluoroacetic acid, chloroacetic acid, lactic acid, malic acid, tartaric acid, citric acid, salicylic acid, p-hydroxybenzoic acid or gallic acid.

* * * * *